United States Patent
Krishnasamy Maniam et al.

(10) Patent No.: US 7,019,593 B2
(45) Date of Patent: Mar. 28, 2006

(54) VARIABLE-GAIN CASCODE AMPLIFIER USING VOLTAGE-CONTROLLED AND VARIABLE INDUCTIVE LOAD

(75) Inventors: Nuntha Kumar Krishnasamy Maniam, Singapore (SG); Yong Zhong Xiong, Singapore (SG)

(73) Assignee: Agency For Science, Technology And Research, Singapore (SG)

( * ) Notice: Subject to any disclaimer, the term of this patent is extended or adjusted under 35 U.S.C. 154(b) by 133 days.

(21) Appl. No.: 10/746,087

(22) Filed: Dec. 26, 2003

(65) Prior Publication Data

US 2005/0140456 A1     Jun. 30, 2005

(51) Int. Cl.
*H03F 1/22*     (2006.01)

(52) U.S. Cl. ...................... 330/302; 330/311
(58) Field of Classification Search ........... 330/169, 330/302, 307, 311; 333/24 R, 177, 214
See application file for complete search history.

(56) References Cited

U.S. PATENT DOCUMENTS

| | | | |
|---|---|---|---|
| 4,166,237 A * | 8/1979 | Van Roessel | ............ 315/370 |
| 6,046,640 A | 4/2000 | Brunner | |
| 6,437,653 B1 | 8/2002 | Cruz et al. | |
| 6,466,095 B1 | 10/2002 | Suzuki | |
| 6,472,936 B1 | 10/2002 | Jones | |
| 6,509,799 B1 * | 1/2003 | Franca-Neto | ............ 330/305 |
| 6,704,559 B1 * | 3/2004 | Hageraats | ............ 455/326 |

OTHER PUBLICATIONS

Siliconix, "FETs as Voltage-Controlled Resistors", Mar. 10, 1997, Sliconix AN105, pp. 1-6.*

* cited by examiner

*Primary Examiner*—Steven J. Mottola
(74) *Attorney, Agent, or Firm*—Conley Rose, P.C.

(57) ABSTRACT

Circuits, such as a cascode amplifier or low noise amplifier, having terminals and a voltage-controlled and variable inductive load are disclosed. Any such circuit comprises an output terminal and a voltage-controlled and variable inductive loading network. The voltage-controlled and variable inductive loading network comprises a primary inductor having a first primary inductor terminal for coupling to a supply voltage, a second primary inductor terminal coupled to the output terminal, a secondary inductor sharing mutual inductance with the first inductor, and a variable resistance device having one terminal connected to a first secondary inductor terminal and another terminal connected to a second secondary inductor terminal, wherein the variable resistance device being dependant on mutual induction between the primary and secondary inductors provides loading at the output terminal.

23 Claims, 4 Drawing Sheets

VARIABLE-GAIN CASCODE AMPLIFIER USING VOLTAGE-CONTROLLED AND VARIABLE INDUCTIVE LOAD

FIELD OF INVENTION

The invention relates generally to loading networks. In particular, the invention relates to cascode amplifiers implemented as low-noise amplifiers having a voltage-controlled and variable inductive loading network for achieving gain control.

BACKGROUND

In the field of transceiver design, meeting the challenge of achieving wide dynamic range for transceivers is a growing concern for designers. To address this issue, variable gain control is typically employed in transceiver blocks so that high gain amplification is applied to weak signals and low gain amplification is applied to strong signals. For designs of transceivers used in high frequency operations, in which process cost is typically high, implementing variable gain control without increasing integrated circuit (IC) or chip semiconductor area is a further challenge.

The amplification of signals in transceivers also typically involves low-noise amplifiers (LNA) or cascode amplifiers. Hence, a number of variable gain control implementations involving LNAs or cascode amplifiers have been proposed.

U.S. Pat. No. 6,046,640 to Brunner proposes an LNA, referring to FIG. 1, in which alternating current (AC) and direct current (DC) through a transistor Q23 are diverted via a transistor Q22 for reducing the gain of the LNA. However, diverting the currents away from the transistor Q23 also inadvertently affects the noise figure of the LNA substantially.

U.S. Pat. No. 6,466,095 to Suzuki proposes a gain control method for cascode amplifiers, referring to FIG. 2, in which the gain of a cascode amplifier is varied by changing the transconductance $g_m$ of a transistor FET 108 through varying a drain to source voltage (VDS) applied to the transistor FET 108. Those skilled in the art can appreciate that the transistor FET 108 behaves as a load to a transistor FET 103 in the cascode amplifier. By changing the transconductance $g_m$ of the transistor FET 108 the load as applied to the transistor FET 103, however, changes and therefore may create stability problems for the transistor FET 103.

U.S. Pat. No. 6,472,936 to Jones proposes a variable gain LNA using a variable inductor method in which variable gain control of the LNA is achieved by dividing an output signal current between the output of the LNA and the supply to the LNA by using an on-chip tapped inductor. By dividing the inductance of the tapped inductor along tap points using transistors and corresponding switches, varying inductances behaving as loads at the output of the LNA are thus realised, which in turn allows for variable gain control. However, parasitic elements are introduced by the transistors which consequently affect performance characteristics of the inductances.

While Jones proposes a variable gain LNA that addresses problems attendant on Brunner and Suzuki, ie, the problems relating to adverse transconductance $g_m$ change by using a variable inductor, to those skilled in the art it is easy to appreciate that in Jones even when any transistor is switched off (high-gain mode), the parasitic element introduced by such a transistor loads the inductive transformer therefore making any high frequency design involving the variable gain LNA a problem. Such an attendant problem hence renders practical implementation of this proposal difficult.

Additionally, high frequency blocks in a transceiver using on-chip variable inductors as matching elements or loads typically suffer from performance degradation due to process variation. Hence it is also necessary to compensate the effect of process variation on the on-chip variable inductor.

In an example of an on-chip variable inductor susceptible to process variation, U.S. Pat. No. 6,437,653 to Cruz et al. proposes an apparatus for providing variable inductance using a magnetic material, in which a variable inductor is implemented for a voltage-controlled oscillator. The variable inductor consists of a primary-spiral inductor magnetically coupled to a control-spiral inductor using magnetic material implanted between the inductors. By feeding a direct current (DC) in the control-spiral inductor, thereby changing the property of the magnetic material, the inductance of the primary-spiral inductor is varied. The drawback of this proposal is that a tedious process of implanting the magnetic material, which is critical to the operation of the variable inductor, between the primary and control-spiral inductors is required. Those skilled in the art can appreciate that such a process is costly and it is typically difficult to control the implantation of such materials.

It is therefore apparent that to address the foregoing problems there is a need for an effective and efficient solution for controlling and varying gains of wide-dynamic range LNAs or cascode amplifiers using on-chip inductive elements as loads.

SUMMARY

In accordance with a second aspect of the invention, a circuit having terminals and a voltage-controlled and variable inductive load is described hereinafter. The circuit comprises an output terminal and a voltage-controlled and variable inductive loading network. The voltage-controlled and variable inductive loading network comprises a primary inductor having a first primary inductor terminal for direct coupling to a supply voltage and a capacitor, a second primary inductor terminal directly coupled to the output terminal, a secondary inductor sharing mutual inductance with the first inductor, and a variable resistance device having one terminal connected to a first secondary inductor terminal and another terminal connected to a second secondary inductor terminal, wherein the variable resistance device being dependant on mutual induction between the primary and secondary inductors provides loading at the output terminal.

In accordance with a second aspect of the invention, a circuit having terminals and a voltage-controlled and variable inductive load is described hereinafter. The circuit comprises an output terminal and a voltage-controlled and variable inductive loading network. The voltage-controlled and variable inductive loading network comprises a primary inductor having a first primary inductor terminal for coupling to a supply voltage, a second primary inductor terminal coupled to the output terminal, a secondary inductor sharing mutual inductance with the first inductor, and a variable resistance device having one terminal connected to a first secondary inductor terminal and another terminal connected to a second secondary inductor terminal, wherein the variable resistance device being dependant on mutual induction between the primary and secondary inductors provides loading at the output terminal.

BRIEF DESCRIPTION OF THE DRAWINGS

Embodiments of the invention are described hereinafter with reference to the drawings, in which.

DETAILED DESCRIPTION

Figure 1:
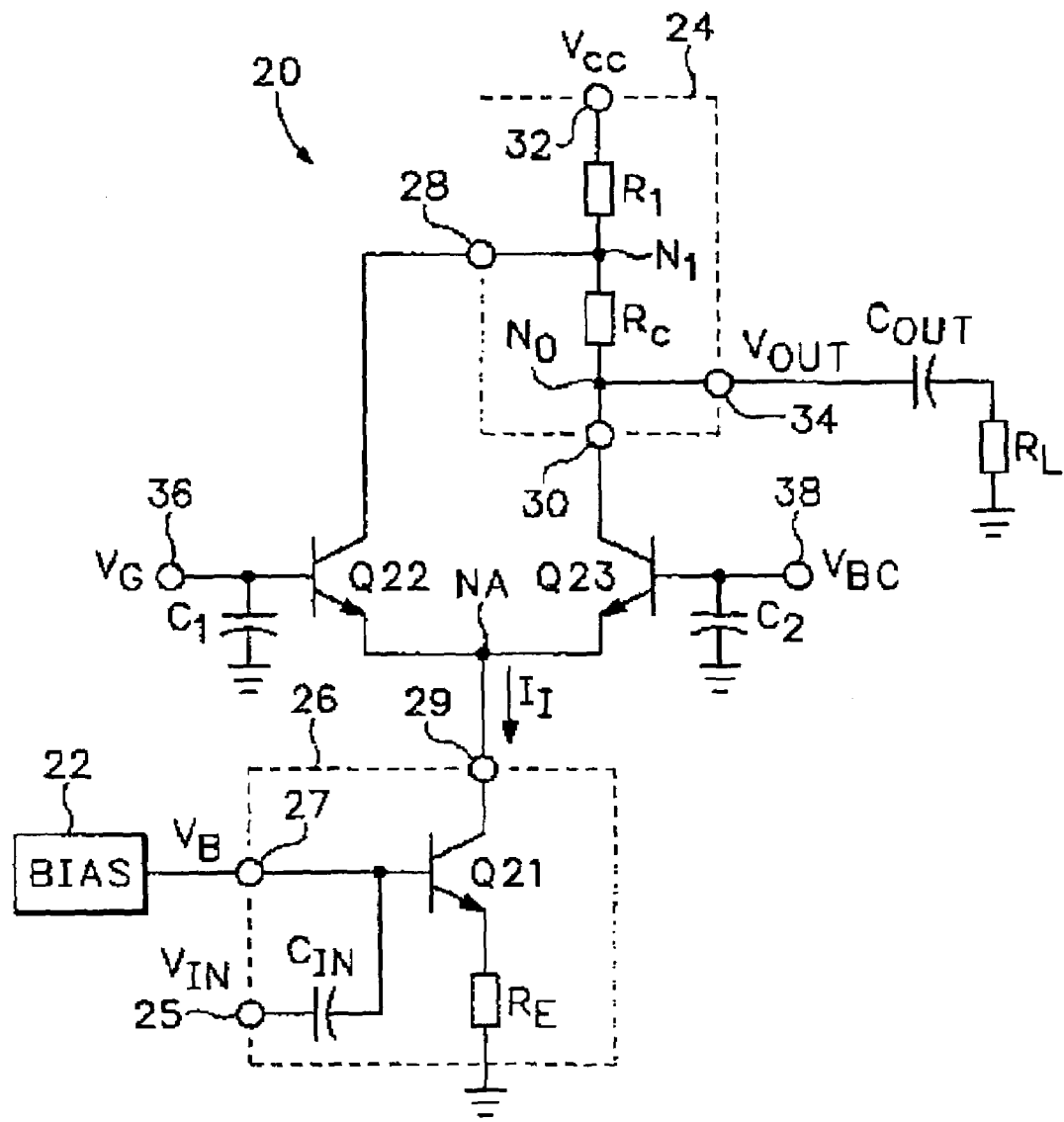
FIG. 1 is a circuit diagram of a prior art LNA.
Figure 2:
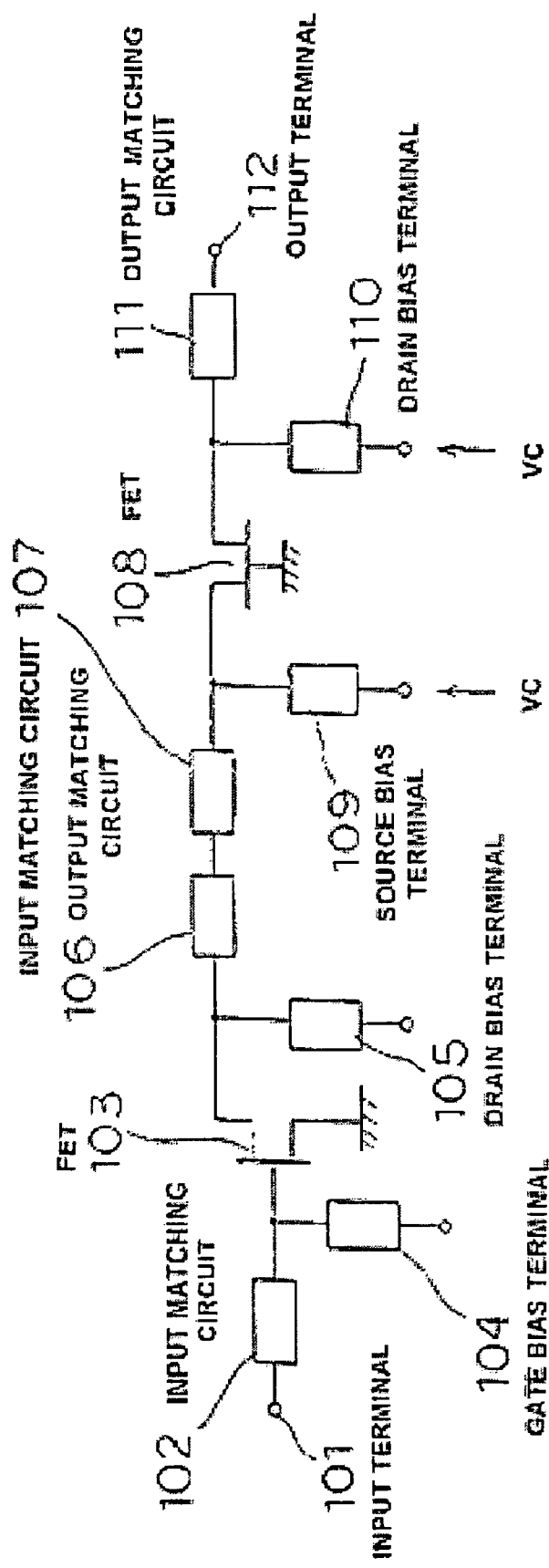
FIG. 2 is a circuit diagram of a prior art cascode amplifier.
Figure 3:
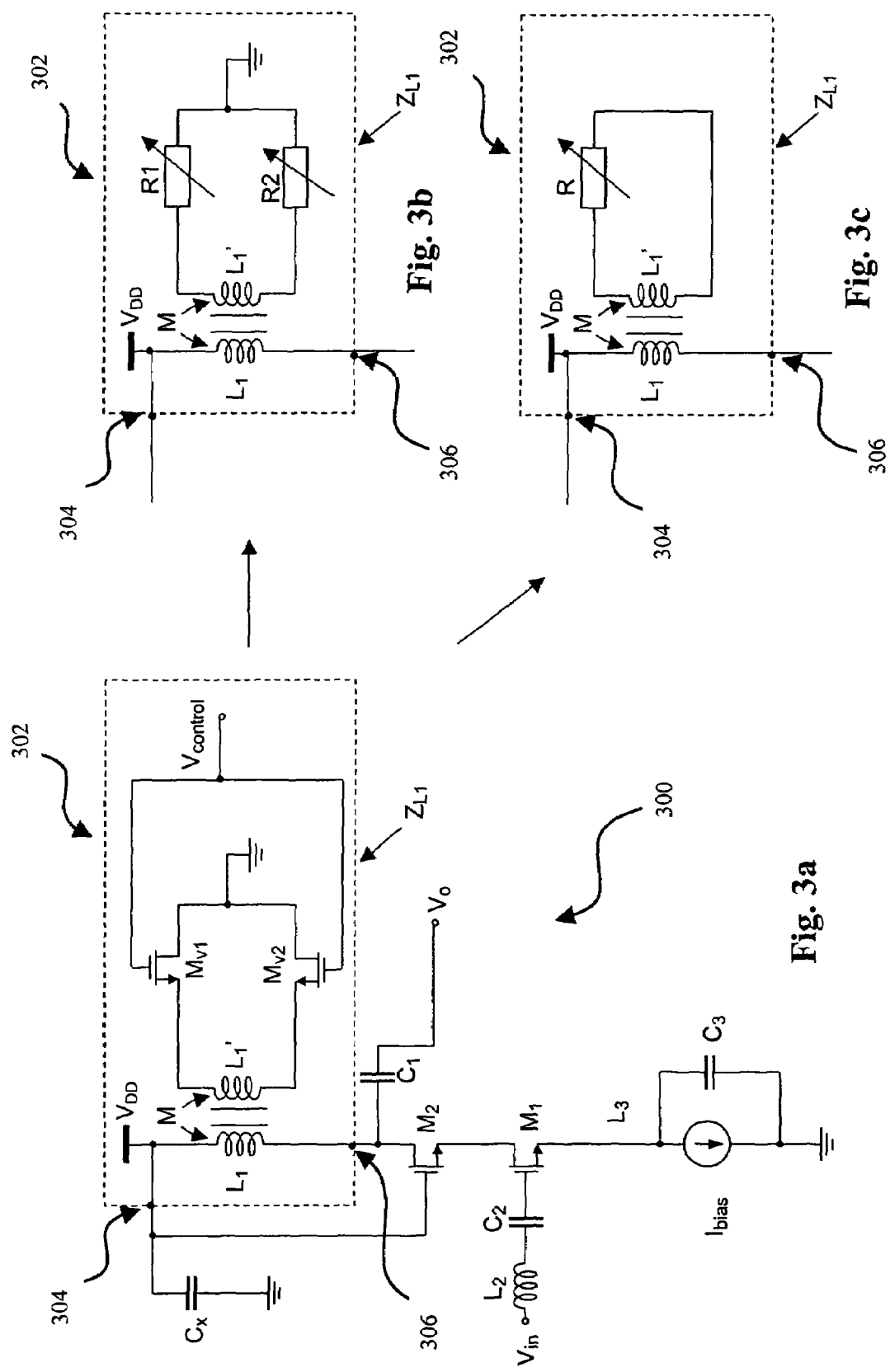
FIGS. 3a to 3c are circuit diagrams relating to various loading configurations of a cascode amplifier according to respective embodiments of the invention.

Embodiments of the invention are described hereinafter for addressing prior art problems by controlling and varying gains of wide-dynamic range LNAs or cascode amplifiers using on-chip inductive elements as variable loads.

For purposes of brevity and clarity, the description of the embodiments is limited hereinafter to cascode amplifiers involving n-channel enhancement-type MOSFETs and inductors forming on-chip impedance transformers. This however does not preclude the application of the embodiments to other circuit variations such as other types of amplifiers like the LNAs or amplifiers involving other types of transistors or other types of impedance-varying or -transforming inductors.

The fundamental principles relating to the embodiments, however, remain the same throughout the variations. Specifically in the embodiments, parameters of an inductor are altered through which impedance control of the inductor is achieved. The solution of variable impedance control of the inductor provided hereinafter addresses the foregoing problems and enables implementation in numerous circuits, such as wide dynamic range LNAs and cascode amplifiers, variable frequency selection filters, multi-band amplifiers, impedance controlled oscillator etc.

Also in the embodiments, DC biasing currents in transistors remain unchanged during gain variation, hence the transconductance $g_m$ of the transistors are kept constant which prevents the variation of the input impedance.

Furthermore in the embodiments, magnetic material is not required and consequently not deposited between a primary inductor and a secondary inductor and thus no additional semiconductor fabrication process is required. By varying the impedance of a secondary load the impedance of the primary inductor is varied. In the embodiments the primary and the secondary inductors share mutual inductance through electromagnetic coupling.

Reference is made to FIGS. 3a to 5 in relation to the description of the embodiments, wherein like elements are assigned and labeled with like numerals and described accordingly.

Shown in FIGS. 3a to 3c are circuit diagrams relating to various loading configurations of a cascode amplifier 300 according to the respective embodiments of the invention, in which the operational equation for achieving small signal voltage gain is given as $$\frac{V_O}{V_{in}} = -g_m Z_{L1}$$

wherein $Z_{L1}$ is the impedance of a gain control circuit 302. The gain control circuit 302 is formed by circuit elements $L_1$, $L_1'$, $M_{v1}$ and $M_{v2}$ in the preferred embodiment shown in FIG. 3a, by circuit elements $L_1$, $L_1'$, $R_1$ and $R_2$ in another embodiment shown in FIG. 3b, and by circuit elements $L_1$, $L_1'$ and R in a further embodiment shown in FIG. 3c.

The gain control circuit 302 is connected to a pair of (MOSFET) transistors $M_1$ and $M_2$ connected in cascode configuration for providing impedance at the output of the cascode amplifier 300 for matching load impedance and therefore for controlling the gain of the cascode amplifier 300.

Figure 4:
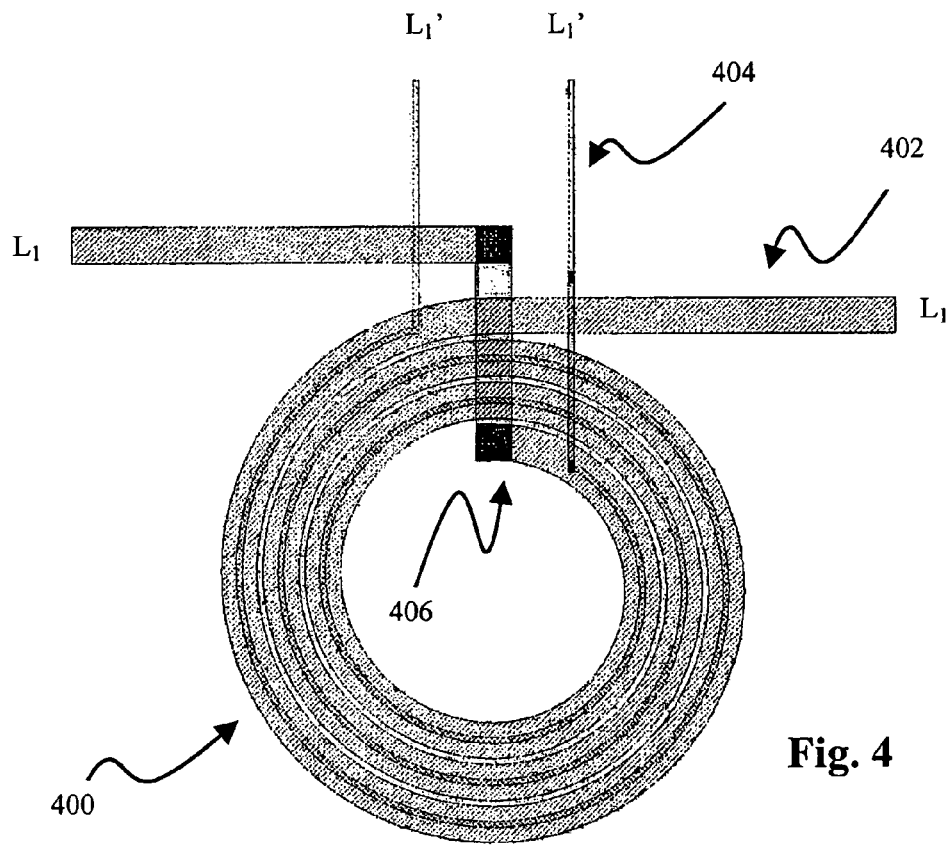
FIG. 4 is a top plan view of a semiconductor pattern of a transformer in the cascode amplifier of FIGS. 3a to 3c.
Figure 5:
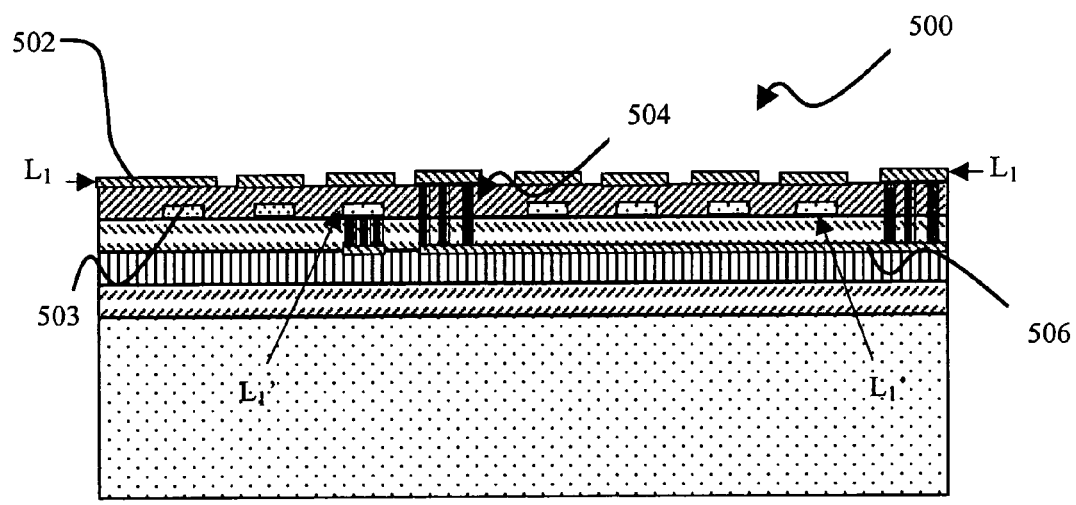
FIG. 5 is a cross-sectional view of the semiconductor pattern of the transformer of FIG. 4.

In the silicon or semiconductor on which the cascode amplifier 300 is formed each of the two inductors $L_1$ and $L_1'$ are vertically displaced from the other, one being a vertical projection of the other, as shown in FIG. 4 and FIG. 5. The inductors $L_1$ and $L_1'$ are fabricated on adjacent metal layers as shown in FIG. 5. Hence, this method of forming the two inductors $L_1$ and $L_1'$ does not increase the chip semiconductor plan area or footprint as the total semiconductor plan area occupied by the two inductors $L_1$ and $L_1'$ is equivalent to the semiconductor plan area occupied by the larger of the two inductors $L_1$ and $L_1'$. In the circuit the inductor $L_1$ behaves as a master coil (primary coil) and the inductor $L_1'$ behaves as a slave coil (secondary coil). The mutual inductance (M) is formed between the inductors $L_1$ and $L_1'$ by means of electromagnetic coupling. In particular, no magnetic material is required between the inductors $L_1$ and $L_1'$.

In the preferred embodiment, the (MOSFET) transistors $M_{v1}$ and $M_{v2}$ collectively behave as a resistive load as applied to the secondary coil $L_1'$, while in the other two embodiments voltage-controlled and variable resistors $R_1$ and $R_2$, or equivalents, and voltage-controlled and variable resistor R, or equivalent, respectively provide resistive loading.

The embodiments are described in greater detail hereinafter.

The small-signal circuit for the cascode amplifier 300 according to the preferred embodiment, as shown in FIG. 3a, relates to the cascode amplifier 300 with variable-gain, the cascode amplifier 300 functioning as an LNA. Input circuit elements $L_2$ and $C_2$ are matching components connected in series with each other and with the gate terminal of the transistor $M_1$ for providing impedance at the input of the transistor $M_1$ for matching source impedance. An input signal is provided to the transistor $M_1$ at the free terminal of the inductor $L_2$. A current source $I_{bias}$ is connected to the source terminal of the transistor $M_1$ for providing a bias current to the transistor $M_1$ and $M_2$, the current source $I_{bias}$ in turn being connected to AC ground. A capacitor $C_3$ is also connected to the source terminal of the transistor $M_1$ across the current source $I_{bias}$ and behaves as an AC short or shunt to provide AC ground to the transistor $M_1$.

The source terminal of the transistor $M_2$ is connected to the drain terminal of the transistor $M_1$ and the gate terminal of the transistor $M_2$ is connected to the AC ground via a capacitor $C_x$ behaving as an AC shunt to form a cascode configuration.

One terminal of the primary inductor $L_1$, being represented by a terminal 304 of the gain control circuit 302, is connected to supply voltage $V_{DD}$ and the gate terminal of the transistor $M_2$. Another terminal of the primary inductor $L_1$, being represented by a terminal 306 of the gain control circuit 302, is connected to the drain terminal of the transistor $M_2$.

An output capacitor $C_1$ is also connected to the drain terminal of the transistor $M_2$, the free terminal of the output capacitor $C_1$ providing an output signal from the cascode amplifier 300.

The primary inductor $L_1$ is coupled to the secondary inductor $L_1'$ by electromagnetic coupling. The secondary inductor $L_1'$ is in turn connected to the source terminal of the transistor $M_{v1}$ at one of its two terminals and to the source terminal of the transistor $M_{v2}$ at the other of its two terminals. The drain terminals of the transistors $M_{v1}$ and $M_{v2}$ are interconnected and connected to the AC ground. The gate terminals of the transistors $M_{v1}$ and $M_{v2}$ are also interconnected and coupled to a control voltage $V_{control}$ for controlling the gain of the cascode amplifier 300.

The circuit elements $L_1$, $L_1'$, $M_{v1}$ and $M_{v2}$ form the gain control circuit 302 having load impedance $Z_{L1}$ as applied to the cascode amplifier 300 according to the preferred embodiment as shown in FIG. 3a.

Alternatively, the circuit elements $L_1$, $L_1'$, $R_1$ and $R_2$ form the gain control circuit 302 having load impedance $Z_{L1}$ as applied to the cascode amplifier 300 according to the second embodiment as shown in FIG. 3b. In such an embodiment, the primary inductor $L_1$ having the terminals 304 and 306 is coupled to the secondary inductor $L_1'$ by electromagnetic coupling. The secondary inductor $L_1'$ is in turn connected to one terminal of the resistor $R_1$ at one of its two terminals and to one terminal of the resistor $R_2$ at the other of its two terminals. The other terminals of the resistors $R_1$ and $R_2$ are interconnected and connected to the AC ground.

In a further alternative, the circuit elements $L_1$, $L_1'$, and R form the gain control circuit 302 having load impedance $Z_{L1}$ as applied to the cascode amplifier 300 according to the third embodiment as shown in FIG. 3c. In such an embodiment, the primary inductor $L_1$ having the terminals 304 and 306 is coupled to the secondary inductor $L_1'$ by electromagnetic coupling. The secondary inductor $L_1'$ is in turn connected to one terminal of the resistor R at one of its two terminals and to the other terminal of the resistor R at the other of its two terminals.

In the preferred embodiment, the impedance $Z_{L1}$ is equated as $$Z_{L1} = j\omega\left(L_1 - \frac{\omega^2 M^2 L_1'}{R_V^2 + \omega^2 L_1'^2}\right) + \frac{\omega^2 M^2}{R_V^2 + \omega^2 L_1'^2}$$

wherein $\omega$ is the operating frequency, $L_1$ is the inductance of the primary coil, M is the mutual inductance, $L_1'$ is the inductance of the secondary coil and impedance $R_v$ is equal to two times of impedance $R_{v1}$ or $R_{v2}$, wherein $R_{v1} = R_{v2}$ and the impedance $R_{v1}$ is the small-signal equivalent impedance of the transistor $M_{v1}$ and the impedance $R_{v2}$ is the small-signal equivalent impedance of the transistor $M_{v2}$. As voltage gain of the cascode amplifier 300 is a function of the load impedance $Z_{L1}$, variable gain can be achieved by varying the load impedance $Z_{L1}$. During normal operation, the control voltage $V_{control}$ is set to 0V. This enables the transistors $M_{v1}$ and $M_{v2}$ to remain in the off state and consequently the resistors $R_{v1}$ and $R_{v2}$ respectively approaches infinity. Under this condition the load impedance is $$Z_{L1(HG)} = j\omega L_1$$

In this state the cascode amplifier 300 operates in a high gain (HG) mode as the impedance $Z_{L1}$ is maximum.

During a low gain mode the control voltage $V_{control}$ is set above the threshold voltage (Vth) such that the transistors $M_{v1}$ and $M_{v2}$ are turned on. With the transistors $M_{v1}$ and $M_{v2}$ in the on state, the impedances $R_{v1}$ and $R_{v2}$ take on a finite value. Hence the load impedance at low gain (LG) mode is $$Z_{LJ} = j\omega\left(L_1 - \frac{\omega^2 M^2 L_1'}{R_V^2 + \omega^2 L_1'^2}\right) + \frac{\omega^2 M^2}{R_V^2 + \omega^2 L_1'^2}$$

Thus $$Z_{L1(HG)} > Z_{L1(LG)}$$

To those skilled in the art it is easy to appreciate that in the second embodiment the impedances of $R_1$ and $R_2$ are equivalent to the impedances $R_{v1}$ and $R_{v2}$, respectively, $R_1$ and $R_2$ being representative of circuits or devices the impedances of which are voltage-controlled and variable, such as the transistors $M_{v1}$ and $M_{v2}$. In the third embodiment, the impedance of R is equivalent to the impedance $R_v$, R being representative of any circuit or device the impedance of which is voltage-controlled and variable, such as the transistors $M_{v1}$ or $M_{v2}$. The foregoing expressions therefore also apply to the second and third embodiments.

In the instance of the preferred embodiment, the value of the impedance $R_v$ at low gain mode is determined by the over drive voltage $(V_{control} - V_{th})$ and the transistor size (W/L) of the transistors $M_{v1}$ and $M_{v2}$. The impedance $R_v$ is given as $$R_V = 2\frac{1}{\mu C_{OX}\left(\frac{W_{Mv1,Mv2}}{L_{Mv1,Mv2}}\right)(V_{control} - V_{th})}$$

where $\mu C_{OX}$ is the process parameter for the transistors $M_{v1}$ and $M_{v2}$.

To those skilled in the art it is easy to appreciate that the mathematical expression given above emphasize only on major contributing components or elements in the circuits. Other minor contributing components or elements are omitted for simplicity.

With reference to FIGS. 4 and 5, a semiconductor pattern 400 of a transformer comprising the primary inductor $L_1$ and secondary inductor $L_1'$ in the cascode amplifier 300 formed on a semiconductor 500 is described. A spiral pattern 402 forming the primary inductor $L_1$ is patterned on a top metal layer 502 of the semiconductor 500 during a semiconductor fabrication process in order to achieve the best quality (Q) factor. A spiral pattern 404 forming the secondary inductor $L_1'$ is patterned on any metal layer 503 below the top metal layer 502.

As the spiral pattern 402 spirals inwardly, the spiral pattern 402 terminates at an innermost winding 406. To ensure that both terminals of the primary inductor $L_1$ are positioned adjacent to each other for practical connection to the other circuit elements, the free end of the innermost winding 406 is connected to vias 504. The vias 504 in turn are connected to one end of a track 506 patterned on a metal layer beneath the metal layer 503 to traverse outwardly and beneath the other windings of the spiral pattern 402. The other end of the track 506 is in turn connected to further vias 504 to the spiral pattern 402 on the top metal layer 502. In a similar manner both terminals of the secondary inductor $L_1'$ are positioned adjacent to each other.

To those skilled in the art it is easy to appreciate that the patterns of the inductors formed may have any shape and is not limited to the foregoing spirals.

The impedance control method of the load impedance $Z_{L1}$ applied to the cascode amplifier 300 can be used for any circuit that uses an inductance either as a load or matching element. The impedance control method can be used to compensate for process variation which under normal circumstances would vary the impedance of the inductor $L_1$. The embodiments are only representative of a form of application and the impedance control method is not limited to this application.

In the foregoing manner, there are wide-dynamic range cascode amplifiers using on-chip inductive elements as variable loads. Although only a number of embodiments of the invention are disclosed, it becomes apparent to one skilled in the art in view of this disclosure that numerous changes and/or modification can be made without departing from the scope and spirit of the invention. For example, the cascode amplifier can also be implemented using BJT, BiCMOS, GaAs, etc and is not limited by the process. The transistors $M_{v1}$ and $M_{v2}$ may have different sizes (i.e different W/L ratio). The transistors $M_{v1}$ and $M_{v2}$ can also be replaced by any circuit, active or passive, to produce a load for the secondary inductor $L_1'$. The inductors $L_1$ and $L_1'$ can be placed in any geometry to generate mutual inductive coupling between the two inductors for sharing mutual inductance. Multiple coils can also be stacked, one on top of the other (i.e. $L_1$, $L_1'$, $L_1''$, etc) to effect similar mutual inductive coupling on the primary inductor $L_1$.

The invention claimed is:

1. A variable gain cascode amplifier comprising:
    an input transistor having a first output terminal for coupling to a bias current and an input terminal for coupling to an input signal;
    a cascode transistor having a first output terminal coupled to a second output terminal of the input transistor and a second output terminal for providing an output signal;
    a primary inductor having a first primary inductor terminal for coupling to a supply voltage, a second primary inductor terminal coupled to the second output terminal of the cascode transistor;
    a secondary inductor sharing mutual inductance with the first inductor; and
    a variable resistance device having one terminal connected to a first secondary inductor terminal and another terminal connected to a second secondary inductor terminal
    wherein the variable resistance device being dependant on mutual induction between the primary and secondary inductors provides loading at the second output terminal of the cascode transistor.

2. The amplifier as in claim 1, wherein the variable resistance device comprises at least one circuit element providing variable resistance.

3. The amplifier as in claim 2, wherein the at least one circuit element is a variable resistor.

4. The amplifier as in claim 2, wherein the at least one circuit element is a transistor.

5. The amplifier as in claim 4, wherein the variable resistance device comprises two transistors, the two transistors being configured as two variable resistance transistors including a first variable resistance transistor and a second variable resistance transistor.

6. The amplifier as in claim 5, wherein a first output terminal of the first variable resistance transistor is coupled to the first secondary inductor terminal and a first output terminal of the second variable resistance transistor is coupled to the second secondary inductor terminal.

7. The amplifier as in claim 6, wherein a second output terminal of the first variable resistance transistor is coupled to a second output terminal of the second variable resistance transistor.

8. The amplifier as in claim 6, wherein an input terminal of at least one of the first and second variable resistance transistor is couplable to a control signal for controlling the state of the at least one of the first and second variable resistance transistor.

9. The amplifier as in claim 1, wherein the primary and secondary inductors are on-chip circuit elements, the primary inductor being patterned on a first semiconductor layer and the secondary inductor being patterned on a second semiconductor layer separate from the first semiconductor layer.

10. The amplifier as in claim 9, wherein the mutual inductance shared between the primary and secondary inductors is dependant on electromagnetic coupling between the primary and secondary inductors during operation of the amplifier.

11. The amplifier as in claim 9, wherein the primary and secondary inductors are patterned as spirals.

12. The amplifier as in claim 1, wherein the input and cascode transistors are n-channel depletion-type metal oxide field-effect transistors.

13. A circuit having terminals and a voltage-controlled and variable inductive load, the circuit comprising:
    an output terminal; and
    a voltage-controlled and variable inductive loading network comprising
        a primary inductor having a first primary inductor terminal for direct coupling to a capacitor and a supply voltage, a second primary inductor terminal directly coupled to the output terminal;
        a secondary inductor sharing mutual inductance with the first inductor, and
        a variable resistance device having one terminal connected to a first secondary inductor terminal and another terminal connected to a second secondary inductor terminal,
    wherein the variable resistance device being dependant on mutual induction between the primary and secondary inductors provides loading at the output terminal.

14. The circuit as in claim 13, wherein the variable resistance device comprises at least one circuit element providing variable resistance.

15. The circuit as in claim 14, wherein the at least one circuit element is a variable resistor.

16. The circuit as in claim 13, wherein the variable resistance device comprises two transistors, the two transistors being configured as two variable resistance transistors including a first variable resistance transistor and a second variable resistance transistor.

17. The circuit as in claim 16, wherein a first output terminal of the first variable resistance transistor is coupled to the first secondary inductor terminal and a first output terminal of the second variable resistance transistor is coupled to the second secondary inductor terminal.

18. The circuit as in claim 17, wherein a second output terminal of the first variable resistance transistor is coupled to a second output terminal of the second variable resistance transistor.

19. The circuit as in claim 17, wherein an input terminal of at least one of the first and second variable resistance transistor is couplable to a control signal for controlling the state of the at least one of the first and second variable resistance transistor.

20. The circuit as in claim 13, wherein the primary and secondary inductors are on-chip circuit elements, the primary inductor being patterned on a first semiconductor layer and the secondary inductor being patterned on a second semiconductor layer separate from the first semiconductor layer, wherein the primary and secondary inductors couple to tracks formed over a face of the second semiconductor layer which outwardly opposes the first semiconductor layer.

21. The circuit as in claim 20, wherein the mutual inductance shared between the primary and secondary inductors is dependant on electromagnetic coupling and independent of magnetic material present between the primary and secondary inductors formed on the first and second semiconductor layers during operation of the circuit.

22. The circuit as in claim 20, wherein the primary and secondary inductors are patterned as spirals, each spiral having an inner end being connected to one of said tracks.

23. The circuit as in claim 13, further comprising a cascode amplifier, wherein the cascode amplifier comprises
an input transistor having a first output terminal for coupling to a bias current and an input terminal for coupling to an input signal, and
a cascode transistor having a first output terminal coupled to a second output terminal of the input transistor and a second output terminal for providing an output signal
wherein the second output terminal of the cascode transistor is connected to the output terminal for providing variable gain control to the cascode amplifier.

* * * * *